United States Patent
Yano

(10) Patent No.: US 8,738,836 B2
(45) Date of Patent: May 27, 2014

(54) NON-VOLATILE SEMICONDUCTOR MEMORY DEVICE AND WRITE-IN METHOD THEREOF

(75) Inventor: Masaru Yano, Hachioji (JP)

(73) Assignee: Powerchip Technology Corporation, Hsinchu (TW)

( * ) Notice: Subject to any disclaimer, the term of this patent is extended or adjusted under 35 U.S.C. 154(b) by 839 days.

(21) Appl. No.: 12/808,265

(22) PCT Filed: Dec. 11, 2008

(86) PCT No.: PCT/JP2008/072507
§ 371 (c)(1),
(2), (4) Date: Jun. 15, 2010

(87) PCT Pub. No.: WO2009/081745
PCT Pub. Date: Jul. 2, 2009

(65) Prior Publication Data
US 2010/0299475 A1    Nov. 25, 2010

(30) Foreign Application Priority Data
Dec. 20, 2007  (JP) ................. 2007-328525

(51) Int. Cl.
*G06F 12/00* (2006.01)
(52) U.S. Cl.
USPC ...... 711/101; 711/103; 365/185.03; 365/184; 365/185.24
(58) Field of Classification Search
None
See application file for complete search history.

(56) References Cited

U.S. PATENT DOCUMENTS

| | | | |
|---|---|---|---|
| 5,299,162 | A | 3/1994 | Kim et al. |
| 6,738,287 | B2 | 5/2004 | Yano |
| 6,879,520 | B2 | 4/2005 | Hosono et al. |
| 6,937,510 | B2 | 8/2005 | Hosono et al. |
| 6,999,344 | B2 | 2/2006 | Hosono et al. |
| 7,009,878 | B2 | 3/2006 | Hosono et al. |

(Continued)

FOREIGN PATENT DOCUMENTS

| | | |
|---|---|---|
| JP | 9-147582 | 6/1997 |
| JP | 2000-285692 | 10/2000 |

(Continued)

OTHER PUBLICATIONS

English International Preliminary Report on Patentability (Chapter 1 of the Patent Cooperation Treaty) (PCT/IB/326, PCT/IB/373) issued Jun. 22, 2010 in International Application No. PCT/JP2008/072507, of which the present application is the U.S. National Stage.

(Continued)

*Primary Examiner* — Alford Kindred
*Assistant Examiner* — Alan Otto
(74) *Attorney, Agent, or Firm* — Wenderoth, Lind & Ponack, L.L.P.

(57) ABSTRACT

A non-volatile semiconductor memory device, comprising: a non-volatile memory array, storing multi-values by setting a plurality of different threshold voltages for each memory cell, and a control circuit, controlling a write-in operation to the memory cell array. When data have been written into the memory cell, the control circuit selects an adjacent word line, uses an erasing level to perform write-in which is weaker than the data write-in, and verifies soft programming of the amount of one page, such that a narrow-banded erasing level distribution is realized in an adjacent memory cell.

8 Claims, 11 Drawing Sheets

(56) References Cited

U.S. PATENT DOCUMENTS

| | | | |
|---|---|---|---|
| 7,215,576 B2 | 5/2007 | Watanabe et al. | |
| 7,292,474 B2 | 11/2007 | Iino et al. | |
| 7,379,340 B2 | 5/2008 | Hosono et al. | |
| 7,567,463 B2 | 7/2009 | Hosono et al. | |
| 7,639,544 B2 | 12/2009 | Hosono et al. | |
| 2007/0121378 A1* | 5/2007 | Shibata et al. | 365/185.03 |
| 2008/0239822 A1 | 10/2008 | Kosaki et al. | |
| 2010/0061149 A1 | 3/2010 | Hosono et al. | |

FOREIGN PATENT DOCUMENTS

| | | |
|---|---|---|
| JP | 2001-28575 | 1/2001 |
| JP | 2001-325796 | 11/2001 |
| JP | 2003-346485 | 12/2003 |
| JP | 2004-326866 | 11/2004 |
| JP | 2006-99912 | 4/2006 |
| JP | 2006-139864 | 6/2006 |
| JP | 2007-207332 | 8/2007 |
| JP | 2007-305204 | 11/2007 |
| JP | 2008-84471 | 4/2008 |

OTHER PUBLICATIONS

English International Preliminary Report on Patentability (Chapter 1 of the Patent Cooperation Treaty) (PCT/IB/338, PCT/IB/373) and Written Opinion of the International Searching Authority (PCT/ISA/237) issued Jul. 20, 2010 in International Application No. PCT/JP2008/072507, of which the present application is the U.S. National Stage.

International Search Report issued Mar. 17, 2009 in International (PCT) Application No. PCT/JP2008/072507.

* cited by examiner

NON-VOLATILE SEMICONDUCTOR MEMORY DEVICE AND WRITE-IN METHOD THEREOF

BACKGROUND OF THE INVENTION

1. Field of the Invention

The present invention relates to an electrically rewritable non-volatile semiconductor memory device, such as a flash memory, etc, and write-in method thereof.

2. Description of the Prior Art

For a NAND type non-volatile semiconductor memory device, a plurality of memory cell transistors (or so-called memory cells hereinafter) are series connected between bit lines and source lines, forming a NAND string. Such NAND type non-volatile semiconductor memory devices are highly integrated and are well known for those skilled in the art (see non-patent documents 1-4).

For common NAND type non-volatile semiconductor memory devices, when an erasing operation is performed, a high voltage, for example, 20V, is applied to a semiconductor substrate thereof and no voltage, for example, 0V, is applied to a word line thereof. Electrons may be removed from a floating gate, a charge storage layer formed of poly-silicon material, such that a threshold voltage becomes lower than an erasing threshold value, for example, −3V. Meanwhile, when a write-in (programming) operation is performed, no voltage, for example, 0V, is applied to a semiconductor substrate thereof and a high voltage, for example 20V, is applied to a controlling gate thereof. Following, electrons are injected from the semiconductor substrate to the floating gate, such that the threshold voltage becomes higher than a write-in threshold voltage, for example, 1V. A state of such a memory cell is determined by identifying a current therethrough, wherein a read-out voltage, for example, 0V, between the write-in threshold voltage and the read-out threshold voltage is applied to the control gate.

For the described non-volatile semiconductor memory device, when a programming operation, such as a write-in operation, is performed to the memory cell which is a write-in target, electrical charges are injected into the floating gate of the memory cell transistor and the threshold voltage rises. Therefore, the state of writing-in data "0" may be achieved, even if a below threshold voltage is applied to the gate, as no current would flow. Commonly, a threshold voltage of a memory cell on an erasing state is not uniform. Therefore, if a determined write-in voltage is applied to carry out a programming operation and threshold voltages are verified that they are higher than a verify-level, the threshold voltages of the memory cell after the write-in operation will have a distribution above the verify-level.

A non-volatile semiconductor memory device including multi-valued memory cells provides multi-values by setting different threshold voltages to the memory cells. In the case of a non-volatile semiconductor memory device, if threshold voltages are widely distributed, the interval between adjacent level voltage values will become narrow, such that it becomes difficult to faithfully store data. To solve this problem, patent document 5 discloses a non-volatile memory core circuit, which stores multi-values by setting a plurality of different threshold voltages to the memory cells. Also a control circuit is disclosed, which controls write-in operations of the memory core circuit. When memory cells are to be programmed to one threshold voltage, the control circuit programs memory cells set at that one threshold voltage and other memory cells set at a threshold voltage which is higher than that one threshold voltage, to that one threshold voltage. The control circuit programs the memory cells from the lowest threshold voltage among the plurality of different voltages to the highest threshold voltage.

Patent document 1 JP H09-147582;
Patent document 2 JP 2000-285692;
Patent document 3 JP 2003-346485;
Patent document 4 JP 2001-028575;
Patent document 5 JP 2001-325796;
Patent document 6 JP 2006-099912;
Patent document 7 JP 2004-326866; and
Patent document 8 JP 2007-207332.

However, in a multi-valued non-volatile semiconductor memory device, when a write-in operation of a memory cell is completed by using a bit line and a word line adjacent to the bit line, the threshold voltage distribution of the memory cell surrounded by the bit line and the word line will rise (this phenomenon is called the "rising threshold voltage distribution", hereafter). As disclosed in Patent document 7, the phenomenon is caused by the capacitive coupling interference effect between the floating gates of memory cells which are contiguous to each other. Also, in the case of a write-in operation of a floating gate of an adjacent memory cell (which means that electrons are injected into a floating gate), the voltage level of the floating gate of a targeted memory cell is drawn down (which means that the threshold voltage rises). The situation is shown in FIG. 5, wherein FIG. 5(a) shows the data of the target memory cell before/after the write-in operation of the adjacent memory cell and FIG. 5(b) shows a write-in operation of an adjacent memory cell which is performed by the write-in method of FIG. 4.

FIG. 4-FIG. 7 show possibility distributions of threshold voltages (Vt distribution) of a 4-valued flash EEPROM based on the write-in method of the prior art and embodiments of the invention. The write-in operation of a 2-bits multi level cell is divided into write-in of the lowest bit (LSB) and write-in of the highest bit (MSB), as shown in FIG. 4(a) and FIG. 4(b), respectively. The reason is the fact that rising threshold voltage distribution which is caused by the shifting of the threshold voltage (Vth) during the LSB write-in operation can be cancelled during the MSB write-in operation. The details are recorded in patent document 8. Here, as shown in FIG. 4, the degree of change for the threshold voltage (Vth) during the MSB write-in operation from the data (1, 1) to the data (0, 1) ΔVth2 is twice as much as that of the degree of change for the threshold voltage (Vth) during the MSB write-in operation from the LSB data (1, 0) to the data (0, 0) ΔVth1. Therefore, the rising phenomenon of the threshold voltage is great. As shown in FIG. 6, to perform a weak write-in operation (soft programming) after data cancelled so as to narrow the distribution width of the threshold voltage after cancellation is attempted.

A soft programming operation of the prior art, is executed within all memory cells and a verifying operation is proceed by all word lines, such that narrowing the distribution of the threshold voltage is limited. If the distribution (1, 1) is able to be narrowed to the distribution shown by oblique lines in FIG. 7, the effect of the threshold voltage may be reduced greatly.

The purpose of this invention is to provide a non-volatile semiconductor memory device and write-in method thereof, which solves the above problems, wherein when a write-in operation of a memory cell is completed by using a bit line and a word line adjacent to the bit line, a rising phenomenon of a threshold voltage of a memory cell surrounded by the bit line and the word line is minimized.

SUMMARY OF THE INVENTION

An embodiment of the non-volatile semiconductor memory device of the invention comprises: a non-volatile memory array, storing multi-values by setting a plurality of different threshold voltages for each memory cell, and a control circuit, controlling a write-in operation to the memory cell array. When data have been written into the memory cell, the control circuit selects an adjacent word line, uses an erasing level to perform write-in which is weaker than the data write-in, and verifies soft programming of the amount of one page, such that a narrow-banded erasing level distribution is realized in an adjacent memory cell.

The above non-volatile semiconductor memory device further comprises a page buffer including a first and a second latch. The control circuit stores page data which are to be written into the memory cell which is the operation target, in the second latch, responds a program generating command of a write-in instruction, transfers the page data from the second latch to the first latch for copying, writes the page data into the memory cell, and then selects an adjacent word line which is to be written in next, uses an erasing level to perform write-in which is weaker than the data write-in, and verifies soft programming of the amount of one page.

The above non-volatile semiconductor memory device of claim 1 further comprises a page buffer including a first and a second latch. The control circuit stores page data which are to be written into the memory cell which is the operation target, in the second latch, responds a program generating command of a write-in instruction, selects an adjacent word line which is to be written in next, uses an erasing level to perform write-in which is weaker than the data write-in, verifies soft programming of the amount of one page, and then transfers the page data from the second latch to the first latch for copying, and writes the page data into the memory cell.

An embodiment of write-in method for a non-volatile semiconductor memory device of the invention is provided, wherein the non-volatile semiconductor memory device comprises: a non-volatile memory array, storing multi-values by setting a plurality of different threshold voltages for each memory cell, and a control circuit, controlling a write-in operation to the memory cell array. When data have been written into the memory cell, the control circuit selects an adjacent word line, uses an erasing level to perform write-in which is weaker than the data write-in, and verifies soft programming of the amount of one page, such that a narrow-banded erasing level distribution is realized in an adjacent memory cell.

In the above write-in method of claim 4, the non-volatile semiconductor memory device further comprises a page buffer including a first and a second latch. The control circuit stores page data which are to be written into the memory cell which is the operation target, in the second latch, responds a program generating command of a write-in instruction, transfers the page data from the second latch to the first latch for copying, writes the page data into the memory cell, and then selects an adjacent word line which is to be written in next, uses an erasing level to perform write-in which is weaker than the data write-in, and verifies soft programming of the amount of one page.

In the above write-in method, the non-volatile semiconductor memory device further comprises a page buffer including a first and a second latch. The control circuit stores page data which are to be written into the memory cell which is the operation target, in the second latch, responds a program generating command of a write-in instruction, selects an adjacent word line which is to be written in next, uses an erasing level to perform write-in which is weaker than the data write-in, verifies soft programming of the amount of one page, and then transfers the page data from the second latch to the first latch for copying, and writes the page data into the memory cell.

Therefore, according to the non-volatile semiconductor memory device and write-in method thereof of the invention, when data have been written into the memory cell, the control circuit selects an adjacent word line, use an erasing level to perform write-in which is weaker than the data write-in, and verifies soft programming of the amount of one page, such that a narrow-banded erasing level distribution is realized in an adjacent memory cell. Therefore, for example, the shift amount of the threshold voltage Vth from data (1, 1) to data (0, 1) is capable of being uniform and minimized, such that the rise phenomenon of the threshold voltage caused by the adjacent bit during the write-in operation can be limited to minimum. Consequently, an estimate for a lead margin becomes easy, and the window between the distributions of the threshold voltages can be ensured. As a result, the error possibility for write-in to and readout from a memory cell can be greatly alleviated.

DETAILED DESCRIPTION OF THE INVENTION

The embodiments of the invention are described below with reference to the enclosed drawings. References are the same for the same elements in each embodiment.

Figure 1:
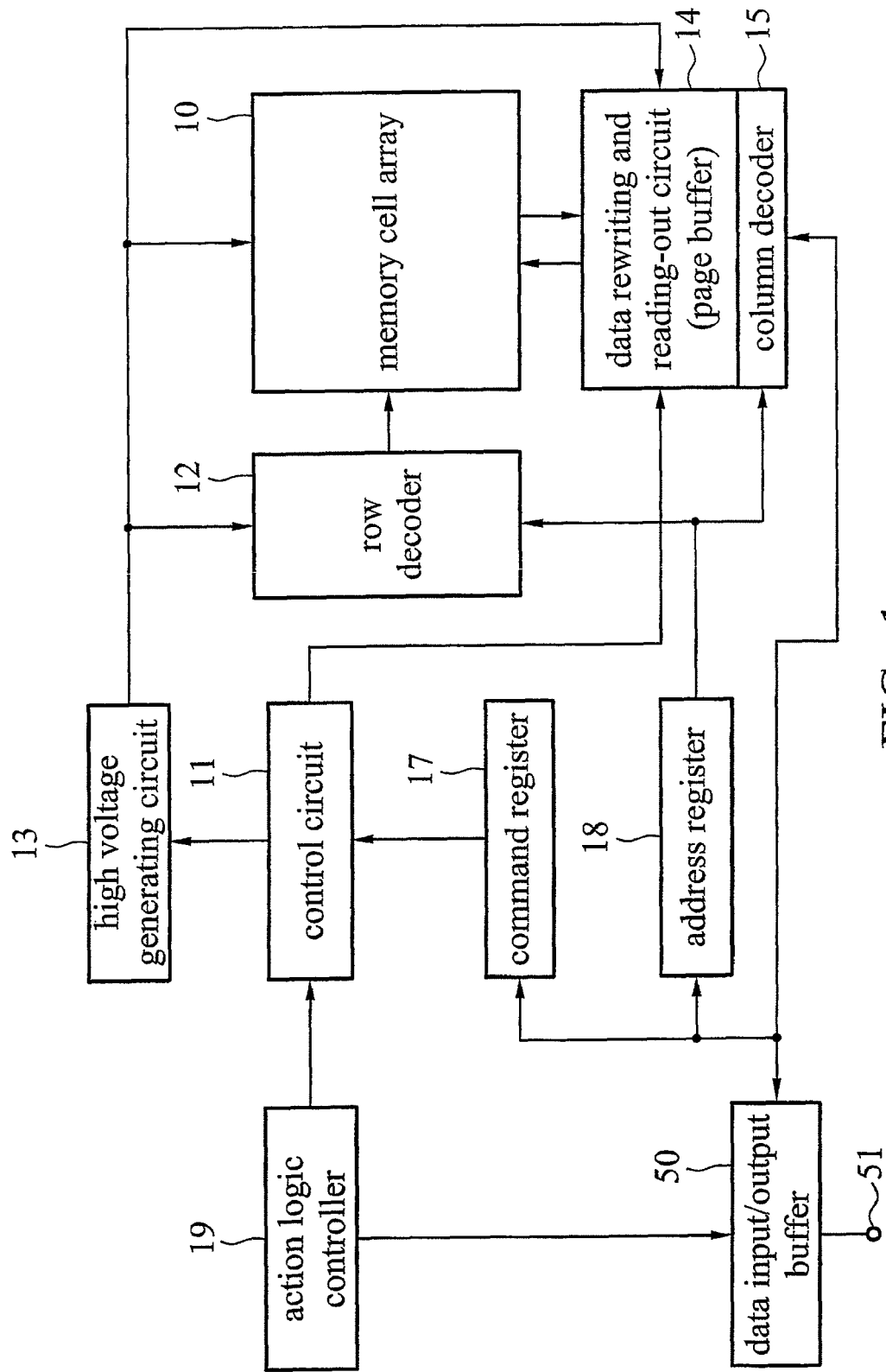
FIG. 1 shows a block diagram of the configuration for a NAND type flash memory EEPROM according to an embodiment of the invention.
Figure 2:
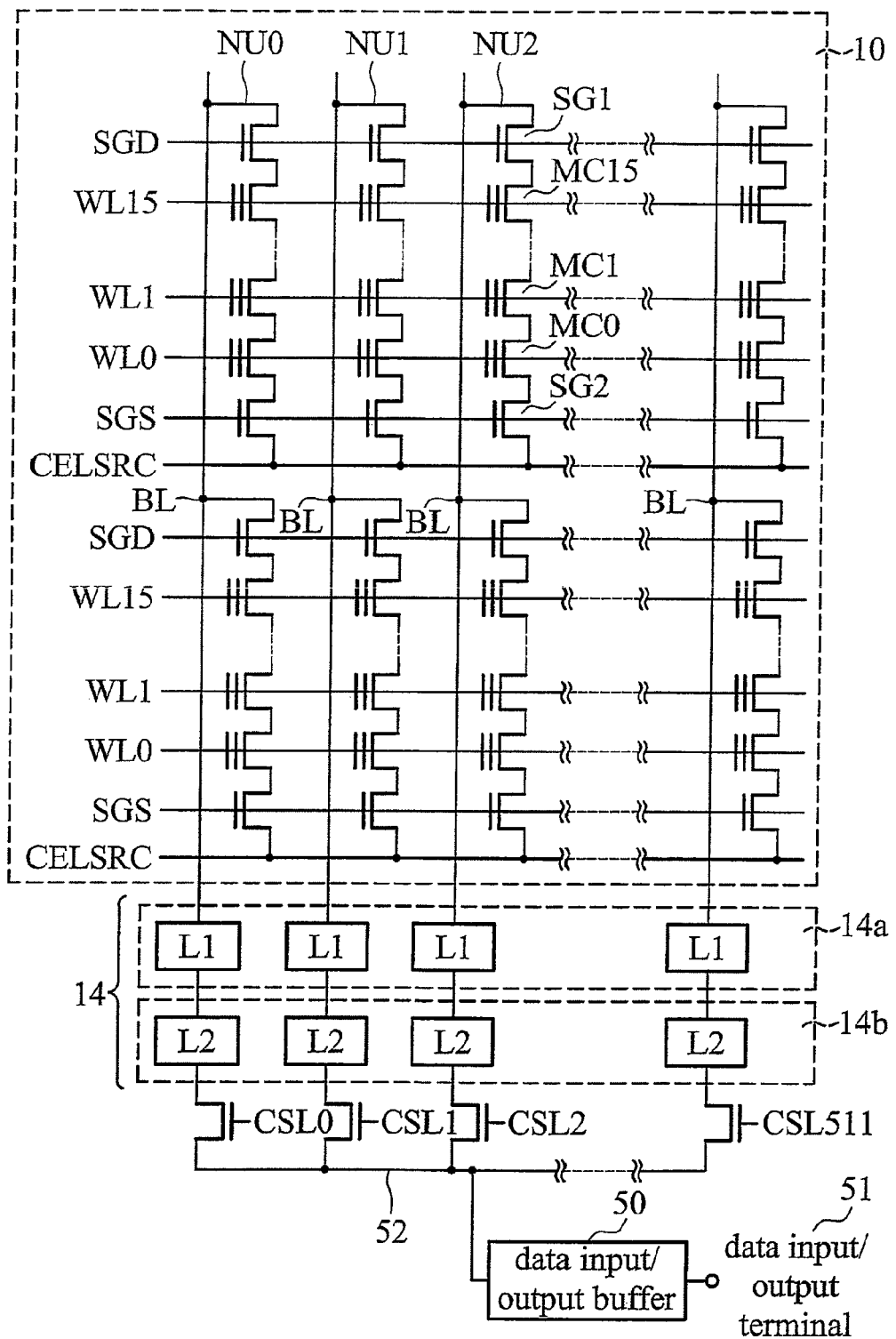
FIG. 2 shows a circuit diagram of the configuration for the memory cell array 10 and the peripheral circuits in FIG. 1.
Figure 3:
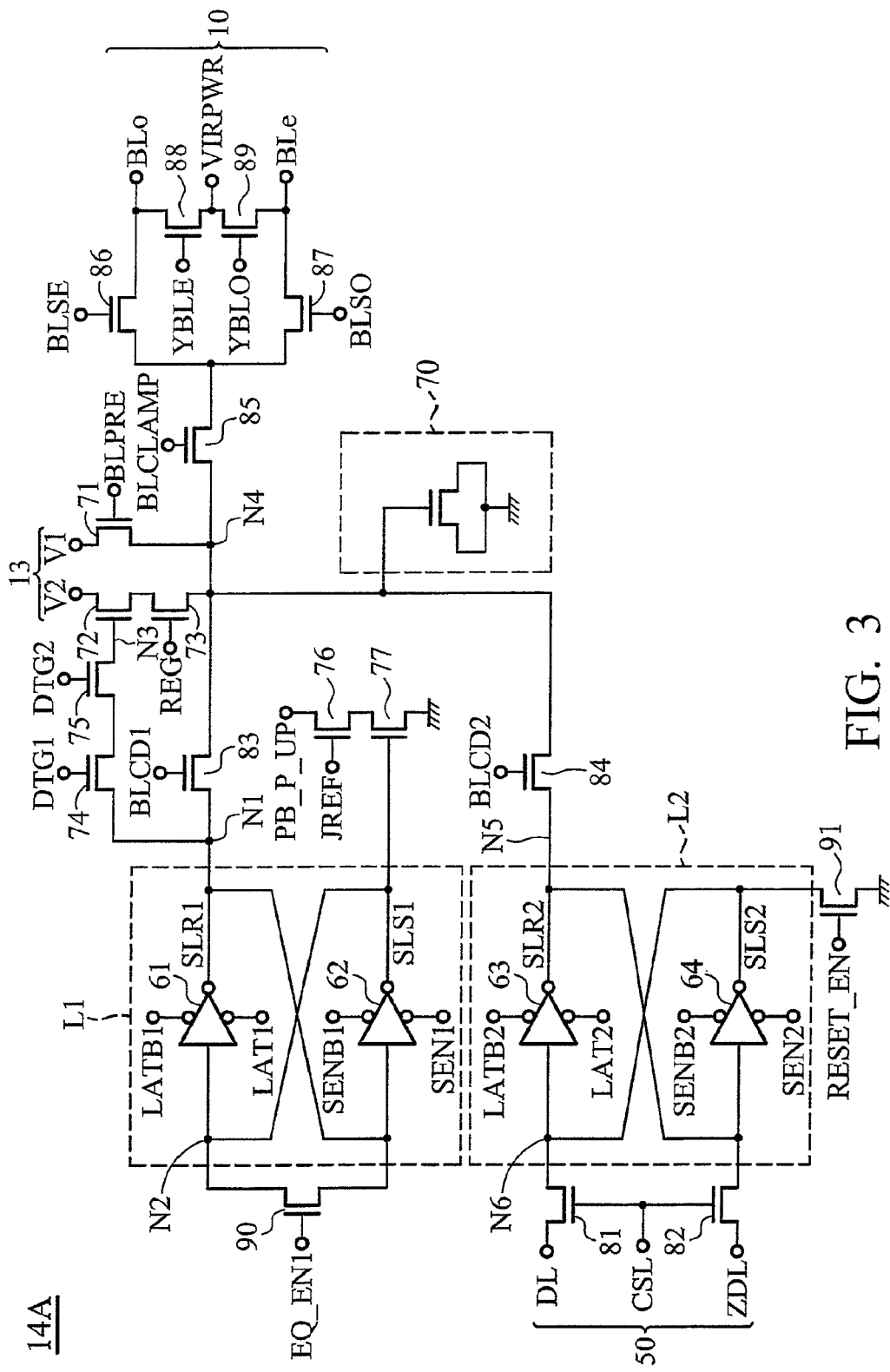
FIG. 3 shows a circuit diagram of the detailed configuration for the page buffer (corresponding to 2 bit lines) in FIG. 2.

FIG. 1 shows a block diagram of the configuration for a NAND type flash memory EEPROM according to an embodiment of the invention. FIG. 2 shows a circuit diagram of the configuration for the memory cell array 10 and the peripheral circuits in FIG. 1. FIG. 3 shows a circuit diagram of a detailed configuration for a page buffer (corresponding to 2 bit lines) in FIG. 2. First, the configuration for the NAND type flash EEPROM of Embodiment is described.

In FIG. 1, an embodiment of a NAND type flash EEPROM of the invention comprises a memory cell array 10, a control circuit 11 for controlling the operation thereof, a row decoder 12, a high voltage generating circuit 13, a data rewriting and reading-out circuit 14, a column decoder 15, a command register 17, an address register 18, an action logic controller 19, a data input/output buffer 50, and a data input/output terminal 51.

In the memory cell array 10 as shown in FIG. 2, a NAND cell NU (NU0, NU1, . . . ) is configured by series connection of 16 stack-gate structured electrically rewritable non-volatile memory cells MC0~MC15. The drain end of each NAND cell NU is coupled to a bit line BL through a selective gate transistor SG1 and the source end of each NAND cell NU is coupled to a common source line CELSRC. The control gates of the memory cells MC arranged in row directions are coupled to a common word line, and gates of the selective transistor SG1, SG2 are coupled to the selective gate lines SGD, SGS arranged parallel to the word lines WL. One page, which is a write-in or readout unit, is a range of the memory cell selected by one word line WL. One block, which is a data erasing unit, is a range of a plurality of NAND cells NU of one page or its integer multiples. In order to carry out rewriting and reading of the data of the page unit, the rewriting and reading-out circuit 14 comprises a sense amplifier circuit (SA) and a latch circuit (DL). The rewriting and reading-out circuit 14 is called a page buffer hereafter.

The memory cell array 10 of FIG. 2 can have a simplified structure wherein a plurality of bit lines can share a page buffer. In this case, when writing in or reading out data, the number of bit lines which are selectively connected to the page buffer is a one page unit. FIG. 2 shows the range of the cell array within which data is input or output by one data input/output terminal 51. In order to select the word line WL of the memory cell array 10 and the bit line BL, the row decoder 12 and the column decode 15 are respectively arranged. The control circuit 11 carries out sequence control of data writing, erasing, and reading. The high voltage generating circuit 13 which is controlled by the control circuit generates a high voltage or a middle voltage used for data writing, erasing, and reading.

The input/output buffer 50 is used to input/output data and output address signals. Specifically, data is transmitted between the input/output terminal 51 and the page buffer 14 through the input/output buffer 50 and the data line 52. The address signals input from the input/output terminal 51 are stored in the address register 18 and sent to the row decoder 12 and the column decoder 15 for decoding. The control command is also input from the input/output terminal 51. The input command is stored in the command register 17 after it is decoded such that the input command is controlled by the control circuit 11. Meanwhile, the external control signals, such as chip enable signals CEB, command latch enable signals CLE, address latch enable signals ALE, write-in enable signals WEB, readout enable signals REB, and so on, are brought into the action logic controller 19. Thus, inner control signals are generated corresponding to an action mode. The inner control signals are used to control data latching or transmitting processes on the input/output buffer 50. Following, the data is transmitted to the control circuit 11 for action controlling.

The page buffer 14 has two latch circuits 14a, 14b for switching between multi-valued action and cache functions. Specifically, when one memory cell memorizes two value data of one bit, a cache function is provided. When one memory cell memorizes four value data of two bits, a cache function is provided and still effective even though the cache function is limited by address. The detailed configuration for the page buffer 14A (corresponding to 2 bit lines) for implementing the function is shown in FIG. 3.

In FIG. 3, the page buffer 14A comprises a latch L1 formed by 2 inverters 61, 62, a latch L2 formed by 2 inverters 63, 64, a verifying capacitor 70, a pre-charging transistor 71, verifying transistors 72-75, verifying and pass/fail-judging transistors 76, 77, column gate transistors 81, 82, transmitting switch transistors 83-85, 88, 89, bit line selecting transistors 86, 87, a latch equalizing transistor 90, a reset transistor 91.

In FIG. 3, 2 bit lines BLe, BLo are selectively coupled to the page buffer 14A. In this case, because of the bit line selecting signal BLSE or BLSO, the bit line selecting transistors 86, 87 are turned on, and one of the bit lines BLe, BLo is selectively coupled to the page buffer 14A. Note that when a bit line is selected, it is preferred that another bit line is set at a fixed ground level or voltage to reduce noise between adjacent lines.

The page buffer 14A of FIG. 3 comprises a first latch L1 and a second latch L2. The page buffer 14A mainly manages readout and write-in operations according to predetermined operation controls. The second latch L2 is a secondary latch circuit performing cache functions in a 2-valued action. When the cache function is not being used, the second latch L2 performs multi-valued actions along with the page buffer 14A.

The latch L1 is configured by inverse parallel-connection of clocked inverters 61, 62. The bit line 10 of the memory cell array 10 is coupled to a sense node N4 via the transmitting switch transistor 85, and the sense mode N4 is coupled to a data holding node N1 of the latch L1 via the transmitting switch transistor 83. At the sense node N4 is configured a pre-charging transistor 71. The node N1 is coupled to a temporally-memorizing node N3, temporally memorize the data of the node N1 connected thereto, via the transmitting switch transistor 74, 75. The node N4 is coupled to the pre-charging transistor 71, for pre-charging a voltage V1 to the bit line. The node N4 is coupled to a capacitor, to maintain voltage levels thereof. The other terminal of the capacitor 70 is coupled to the ground.

The second latch L2 is configured by inverse parallel-connection of clocked inverters 63, 64 as well as the first latch L1. Two data nodes N5, N6 of the latch L2 are coupled the data line 52, which is coupled to the data input/output buffer 50, via the column gate transistors 81, 82, which are controlled by a column selecting signal CSL. The node N5 is coupled to the node N4 via the transmitting switch transistor 84.

FIG. 3 shows the connection between the memory array cell 10, the page buffer 14, and the data input/output buffer 50. A processing unit of measurement of the NAND type flash EEPROM performing readout and write-in operations is the amount of one page simultaneously selected at a row address (for example 512 bytes). Because there are 8 data input/ output terminals 51, each data input/output terminal 51 transmits 512 bits. FIG. 3 shows the above configuration corresponding to 512 bits.

In the case where data are written-in to the memory cell, the write-in data is taken into the second latch L2 from the data line 52. The write-in data must be at the latch L1 to start the write-in operation. Therefore, the data held by the latch L2 are subsequently transmitted to the latch L1. In the readout operation, the readout data must be at the latch L2 to be output from the data input/output terminal 51. Therefore, the data readout by the latch L1 needs to be transmitted to the latch L2. Consequently, the configuration can transmit data between the latch L1 and the latch L2 by turning on the transmitting transistors 83, 84. At this time, a latch circuit which is a destination is switched to on an inactive state and transmits the data, and then the latch circuit which is a destination is switched back to on an active state and holds the data.

In FIG. 1-FIG. 3, the basic operations of writing-in or erasing data to the memory cell 10 according to prior art, which is disclosed by, for example, non-patent documents 4-5, is shown. Detailed description is omitted.

The embodiment discloses a method for a flash EEPROM to limit the effect of an adjacent bit line during the write-in operation to a minimum. In the method, the suppression of the effect which may happen is accomplished by narrowing the distribution width of the threshold voltage of the erasing level of a word line which is to be selected, after a word line selected. Therefore, the rise effect of the threshold voltage, caused by the write-in operation of a next selected word line, can be reduced.

Figure 4A:
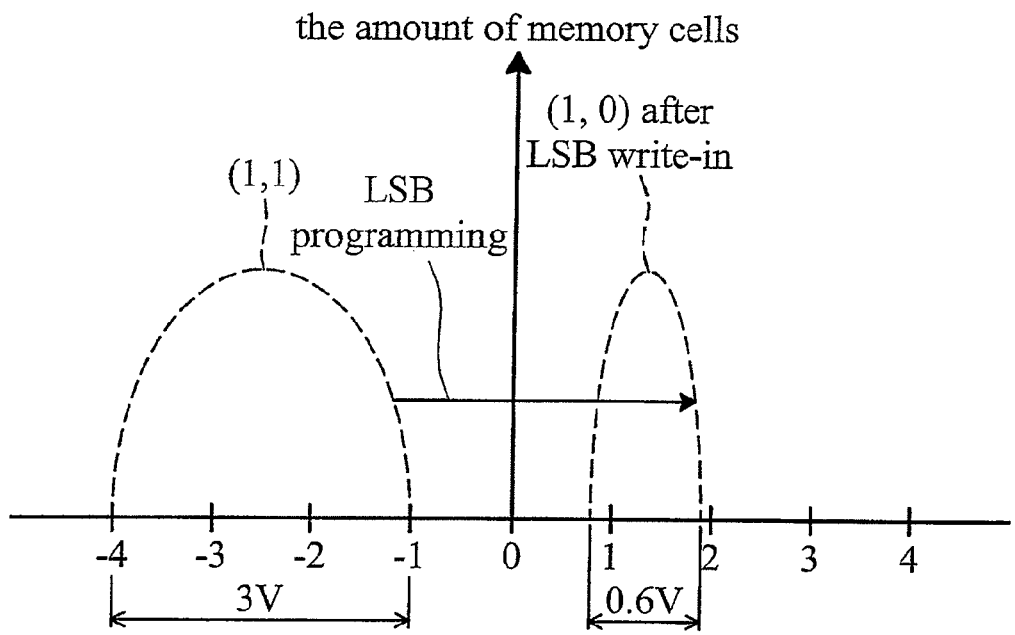
FIG. 4(a) is a diagram of a possibility distribution of threshold voltages of a 4-valued flash EEPROM based on the write-in method of the prior art and shows the data (1, 0) after the LSB write-in from the data (1, 1).
Figure 4B:
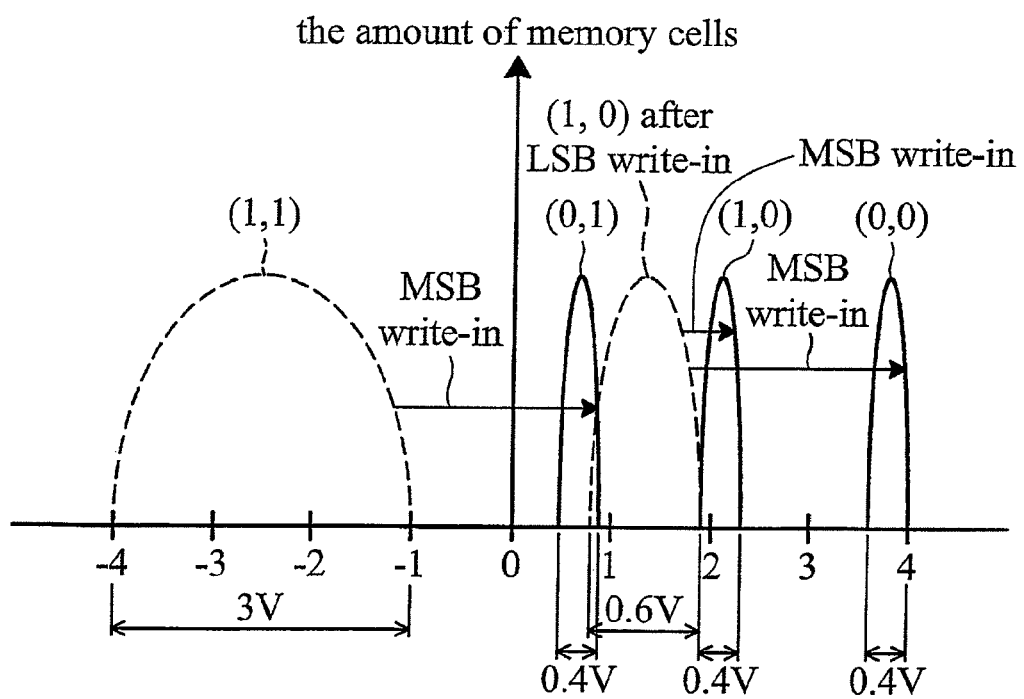
FIG. 4(b) is a diagram of a possibility distribution of threshold voltages of a 4-valued flash EEPROM based on the write-in method of the prior art and shows the data after the MSB write-in from different data.
Figure 5A:
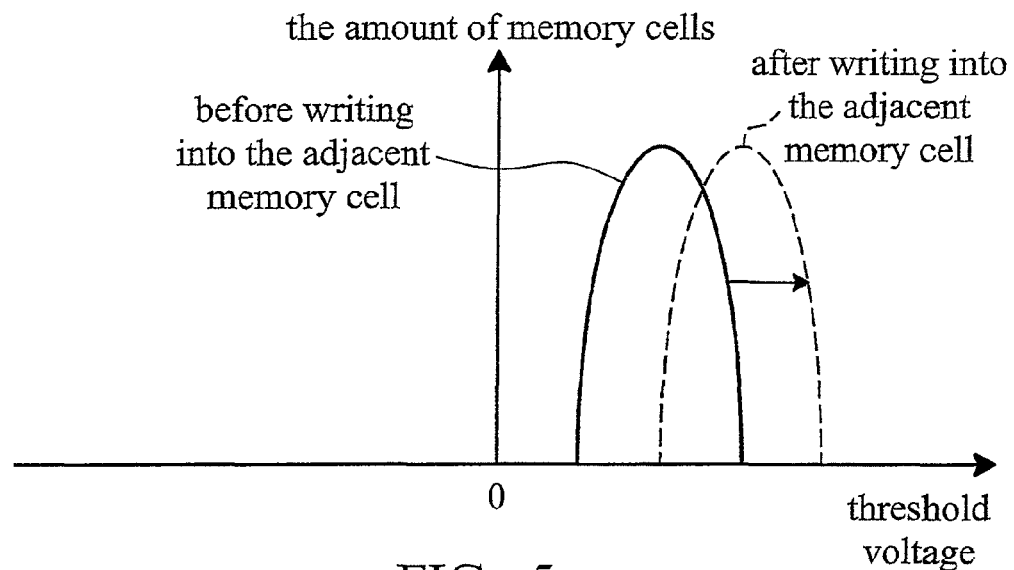
FIG. 5(a) shows the data of the target memory cell before/after the write-in operation of the adjacent memory cell.
Figure 5B:
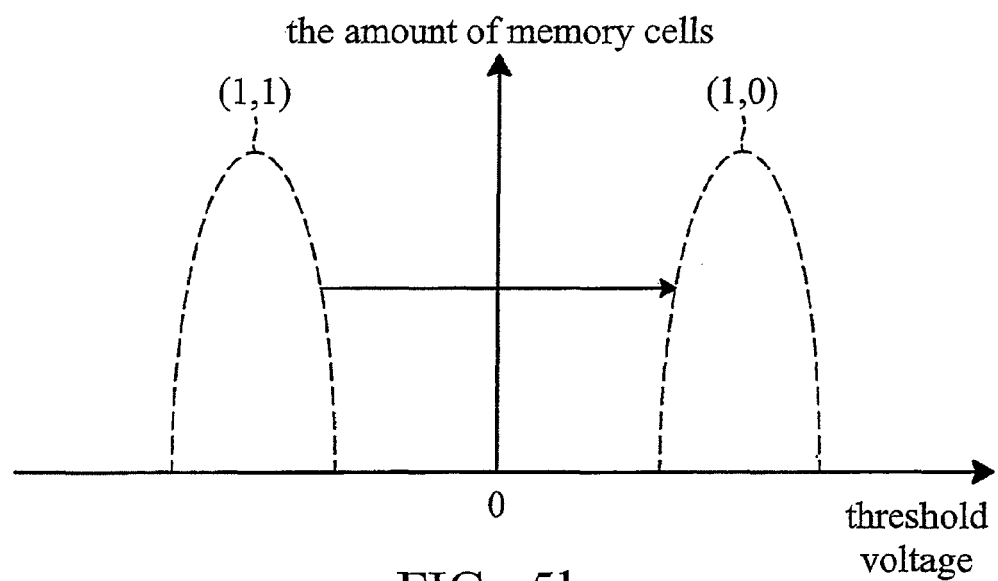
FIG. 5(b) shows a write-in operation of an adjacent memory cell which is performed by the write-in method of FIG. 4.
Figure 6:
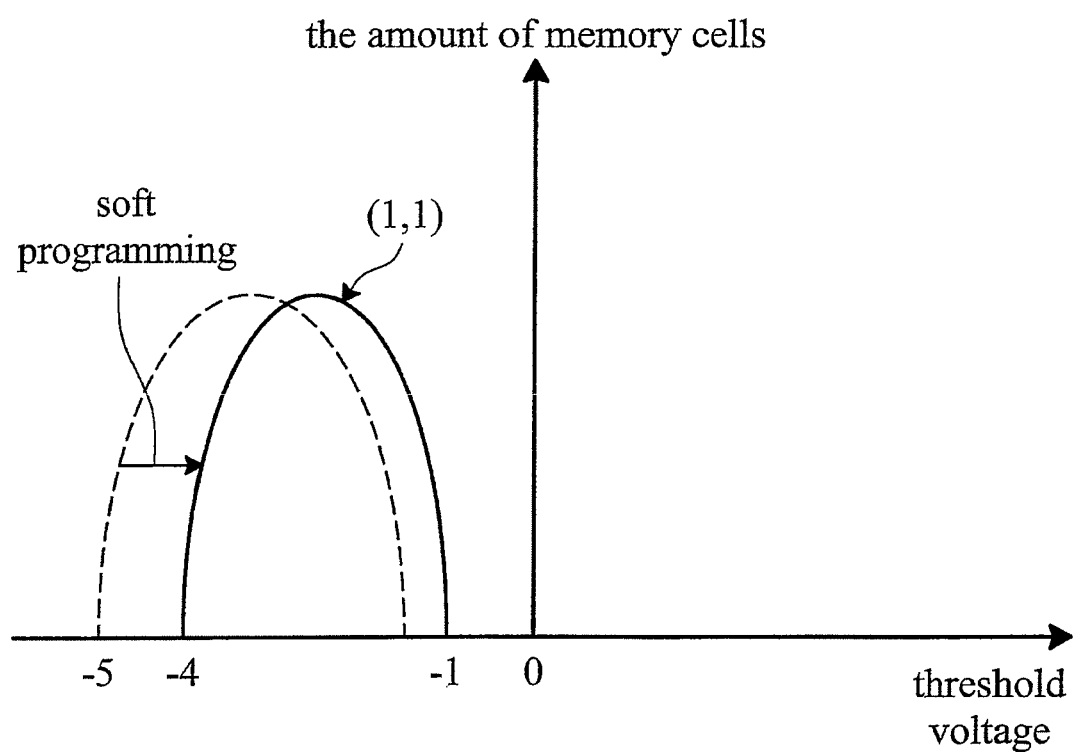
FIG. 6 is a diagram of a possibility distribution of threshold voltages of a 4-valued flash EEPROM based on the write-in method of an embodiment of the invention and shows soft programming to the data (1, 1).

After the erasing operation, the threshold voltage distribution width is, for example, 2V-3V, as shown in FIG. 4-FIG. 6. Accordingly, although a weak write-in pulse is applied to minimize the threshold voltage during the erasing operation, the effect is still little because of too many numbers of times to verify in each operation. Following, in the case where a verifying operation is performed to each word line, the entire erasing becomes longer. Therefore, the problem is solved by selecting an adjacent word line when the write-in operation starts, performing the write-in operation which is weaker than that of the data write-in operation, and performing a verifying operation of the amount of one page as a usual data write-in operation.

Figure 8:
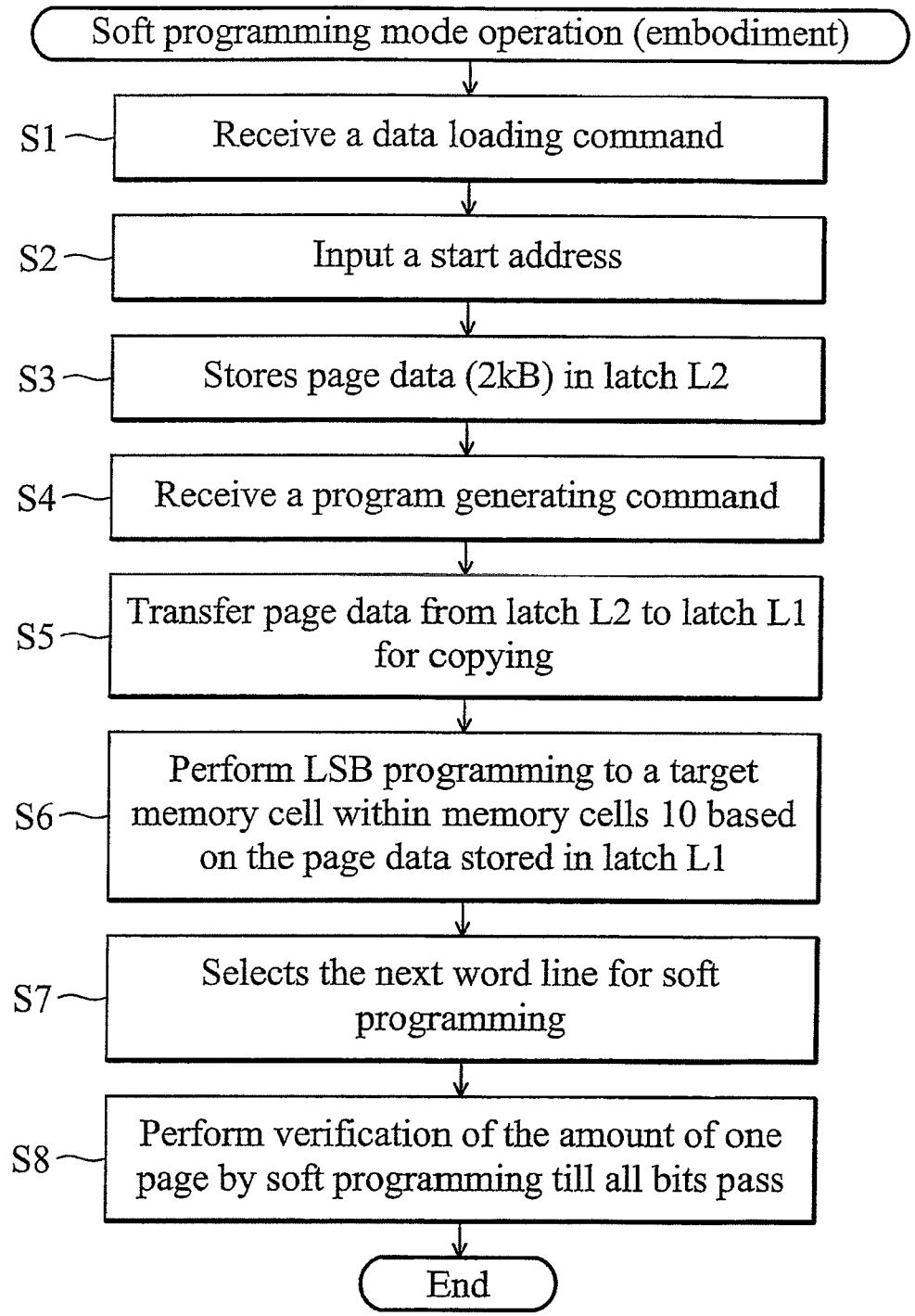
FIG. 8 shows a flowchart representing a soft programming mode operation related to an embodiment of the invention.

FIG. 8 shows a flowchart representing a soft programming mode operation implemented by the control circuit 11 of FIG. 1 according to an embodiment of the invention.

In FIG. 8, first, the control circuit receives a data loading command at step S1 and inputs a start address at step S2. Following, the control circuit stores page data (2 kB) in latch L2 at step S3 and receives a program generating command at step S4. Then the control circuit transfers page data from latch L2 to latch L1 for copying at step S5 and performs LSB programming to a target memory cell within the memory cells 10 based on the page data stored in latch L1 at step S6.

Subsequently, the control circuit selects the next word line adjacent to the word line which is in the operation for soft programming at step S7 and performs a verifying operation of the amount of one page by soft programming till all bits pass at step S8. Here, the soft programming operation is performed to all of the memory cells within the amount of one page.

Each kind of voltage in the soft programming mode operation according an embodiment of the invention is shown below. Although a weak write-in operation is the same as a usual write-in operation related to the prior art, there is a difference about the word line WL voltage during the programming operation and that during the verifying operation (especially the word line WL voltages during the verifying operation). In the case where the bit line BLo of FIG. 3 is selected, an example for each voltage to certain lines is shown in the following chart.

CHART 1

| | Usual write-in | Usual verification | Soft programming | Verification of soft programming |
|---|---|---|---|---|
| L1, SLR1 | 0 V (during write-in) Vdd (after write-in) Vdd (no wrote-in) | 0 V Vdd Vdd | 0 V (during write-in) Vdd (after write-in) — | 0 V Vdd — |
| BLo | =SLR1 | | | |
| BLe | Vdd | 0 V | Vdd | 0 V |
| WL(selected) | 17~25 V | 0.5~4 V | 12~20 V | 0~0.5 V |
| SL | 1.5~2 V | 0 V | 1.5~2 V | 0.2~0.5 V |

Figure 7:
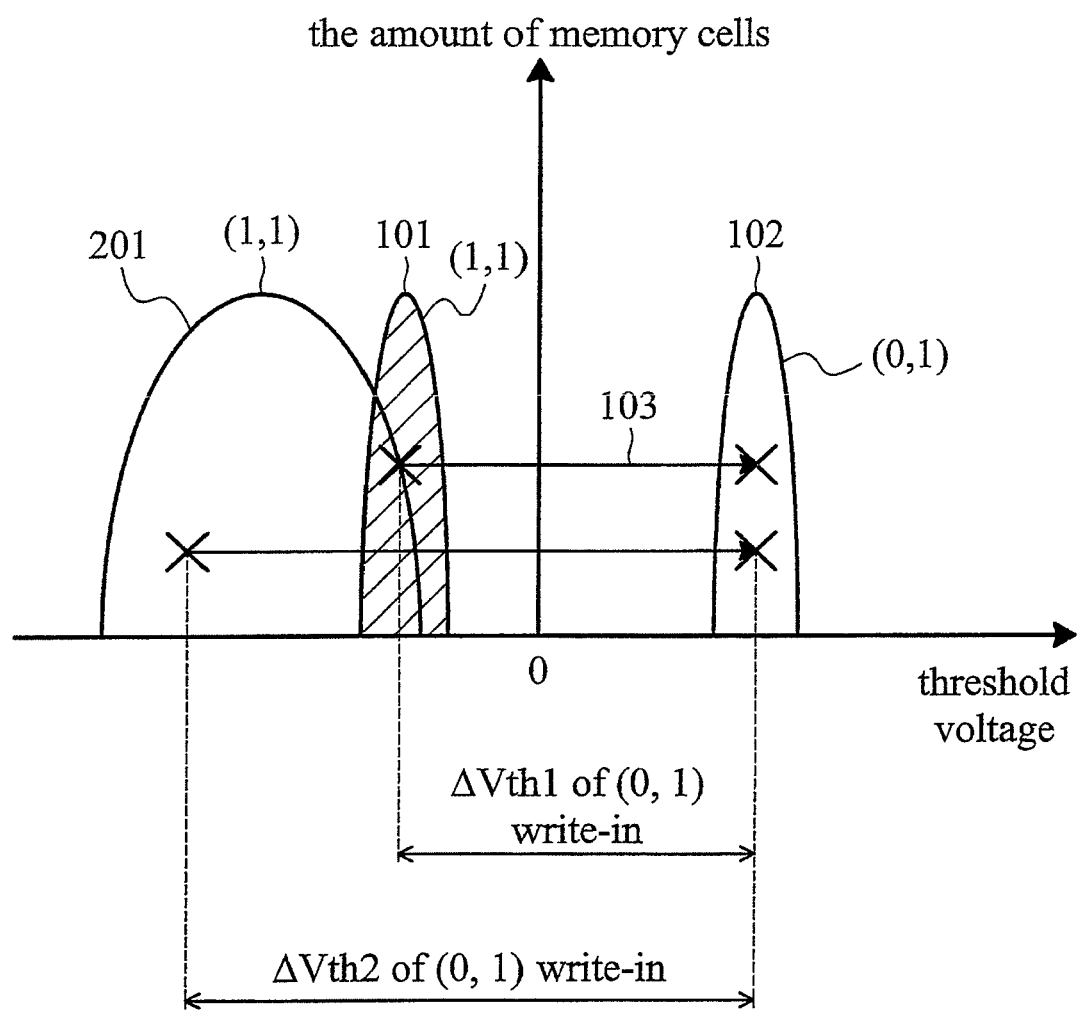
FIG. 7 is a diagram of a possibility distribution of threshold voltages of a 4-valued flash EEPROM based on the write-in method of the prior art, wherein the voltage change of the threshold voltage is shown, during the write-in operation to the data (0, 1), to depend on the soft programming to the data (1, 1)

According to the embodiment, when data are written into a memory cell in the memory cell array, an adjacent word line is selected, a write-in operation which is weaker than that of the data write-in operation is performed, and a verifying operation of the amount of one page is performed. Accordingly, as shown by the arrow 103, which is from the threshold voltage distribution 101 to 102, in FIG. 7, the write-in operation from an erasing level distribution in which a weak write-in operation related to the invention is performed is not a large threshold voltage shift. Therefore, the rise effect of the threshold voltage of a word line which is to be selected and written-in after the word line which is being selected can be reduced (refer to the threshold voltage distribution shown by oblique lines 101 of FIG. 7). The effect of the adjacent bit line happening during the write-in operation can be minimized. Consequently, estimating a lead margin becomes easy, and the window between the distributions of the threshold voltages can be ensured. As a result, the probability for error of a write-in operation to and readout operation from a memory cell can be greatly alleviated.

In the flow chart of the soft programming mode operation related to the embodiment of FIG. 8, soft programming of the erasing level distribution of an adjacent memory cell on an adjacent word line is performed after the LSB data write-in operation to the selected memory cell, but soft programming can also be performed before the LSB data write-in operation to the selected memory cell or even before the MSB data write-in operation to the selected memory cell. These modifications are described below.

Figure 9:
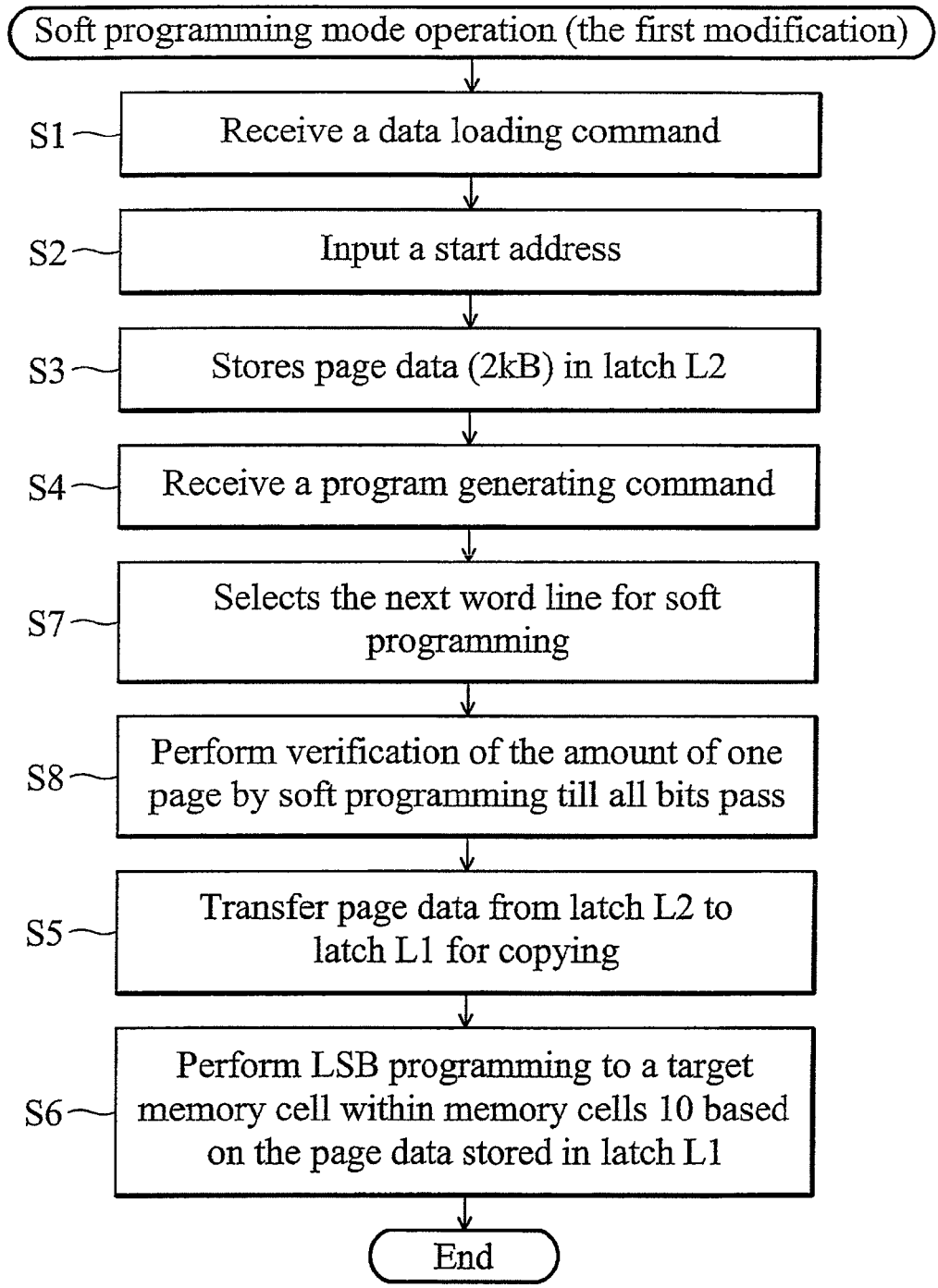
FIG. 9 shows a flowchart representing a soft programming mode operation related to a first modification to the embodiment of the invention.
Figure 10:
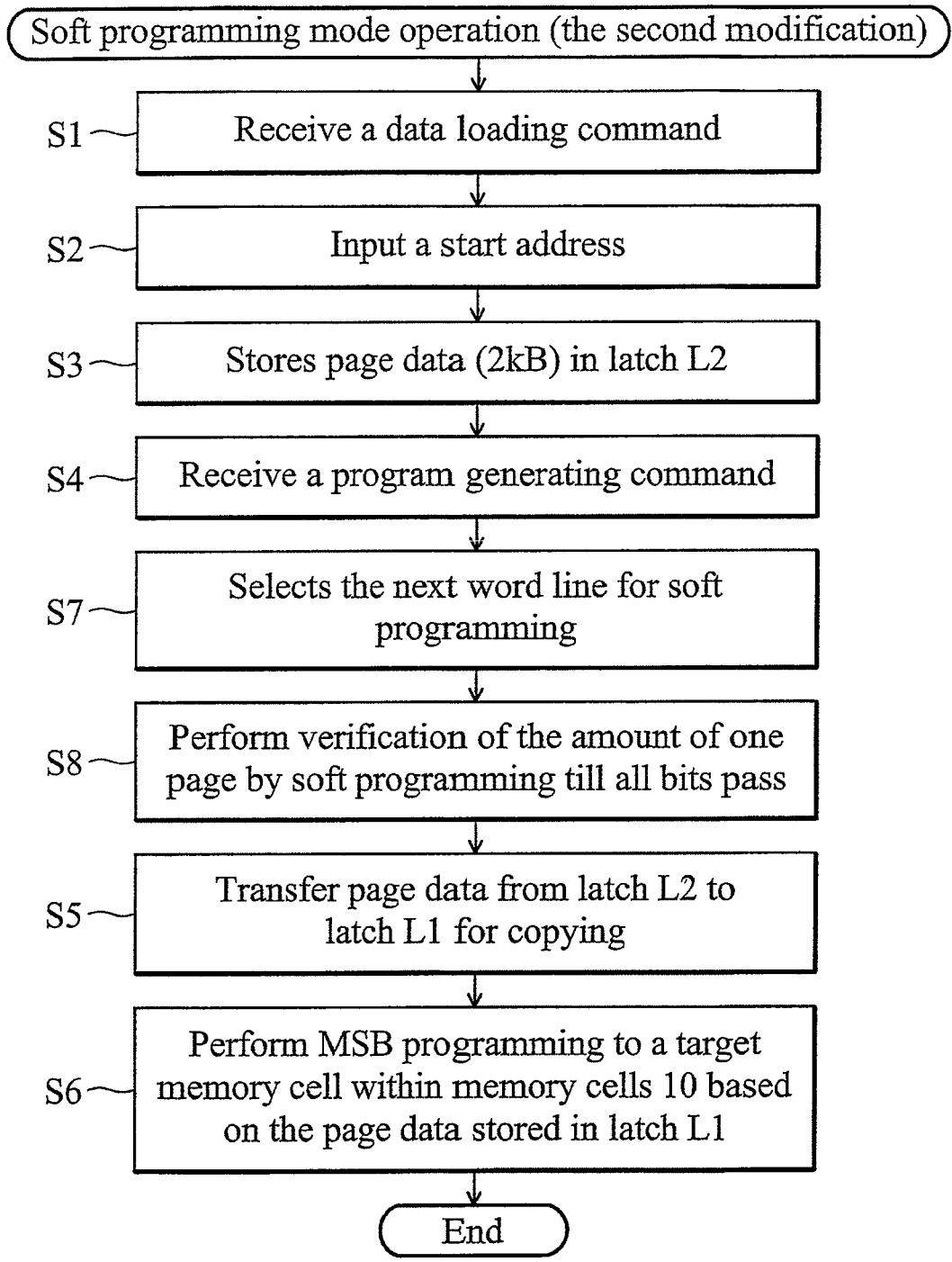
FIG. 10 shows a flowchart representing a soft programming mode operation related to the second modification to the embodiment of the invention.
Figure 11:
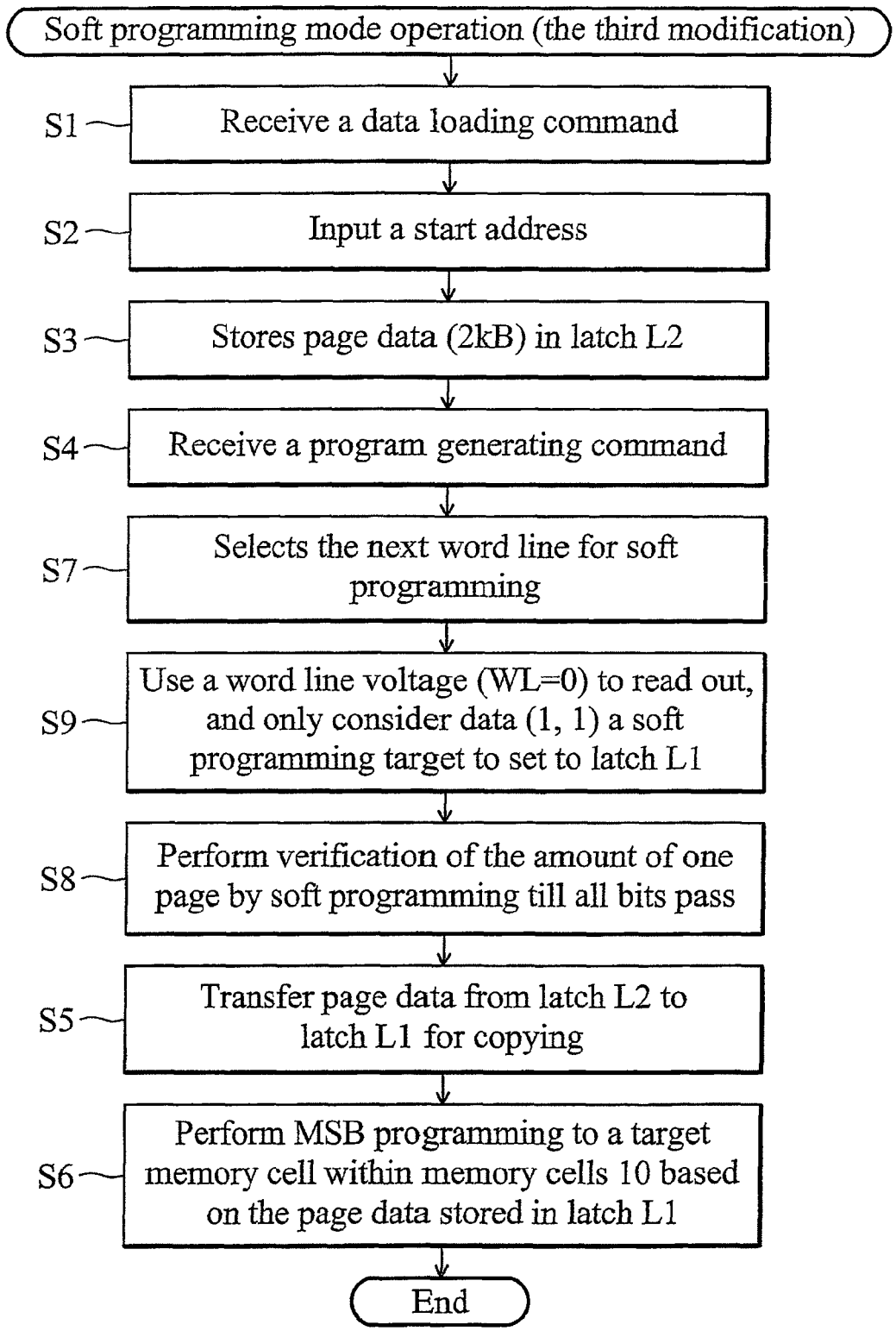
FIG. 11 shows a flowchart representing a soft programming mode operation related to a third modification to the embodiment of the invention.

FIG. 9 shows a flowchart representing a soft programming mode operation related to a first modification to the embodiment of the invention. In comparison with the operation of FIG. 8, the operation of FIG. 9 inserts step S7 and S8 into between step S4 and step S5. FIG. 10 shows a flowchart representing a soft programming mode operation related to the second modification to the embodiment of the invention?. In comparison with the operation of FIG. 9, the operation of FIG. 10 replaces LSB programming with MSB programming at step S6. FIG. 11 shows a flowchart representing a soft programming mode operation related to a third modification to the embodiment of the invention. In comparison with the operation of FIG. 10, the operation of FIG. 11 inserts the step S9 "Use a word line voltage (WL=0) to read out, and only consider the data (1, 1) as a soft programming target to set to latch L1" into between step S7 and step S8. In the operation of FIG. 10, although soft programming is performed by ignoring the LSB data written into the adjacent memory cell, there is almost no influence because verification to the data (1, 0) would pass in one write-in operation. In the operation of FIG. 11, the insertion of step S9 is to solve the problem.

A NAND type flash EEPROM is described in the above embodiment, but the invention is not limited thereto and can also be applied to non-volatile semiconductor memory devices which write data into a floating gate of a NOR type flash EEPROM and etc.

In the above embodiment, the threshold voltage distribution of FIG. 4 is used and the assumption that the lowest voltage would be used to program the data, but the invention is not limited thereto and can be applied to program any data of multi-values.

Therefore, according to the invention described above, when data is written into the memory cell, the control circuit selects an adjacent word line, uses an erasing level to perform a write-in operation which is weaker than that of the data write-in operation, and verifies soft programming of the amount of one page, such that a narrow-banded erasing level distribution is realized in an adjacent memory cell. Therefore, for example, the shift amount of the threshold voltage Vth from the data (1, 1) to the data (0, 1) is capable of being uniform and minimized, such that the rising phenomenon of the threshold voltage caused by the adjacent bit during the write-in operation can be limited to a minimum. Consequently, lead margin estimation is easier, and the window between the distributions of the threshold voltages can be ensured. As a result, the error possibility of write-in to and readout from a memory cell can be greatly alleviated. The invention can be applied to non-volatile semiconductor memory devices which write data into a floating gate of a NAND type flash EEPROM, a NOR type flash EEPROM, or the like.

The invention claimed is:

1. A non-volatile memory device, comprising:
a non-volatile memory cell array having a plurality of memory cells for storing multi-values by setting a plurality of different threshold voltages for each memory cell of the memory cell array; and
a control circuit, controlling a write-in operation to the memory cell array,
wherein when data has been written into a memory cell, the control circuit selects an adjacent word line, uses an erasing level to perform write-in which is weaker than the data write-in, and verifies soft programming of the amount of one page, such that a narrow-banded erasing level distribution is realized in an adjacent memory cell, the data of one page being a set of bit data which is to be written into a plurality of memory cells on a word line during one write-in operation, and
the control circuit stores LSB (Least Significant Bit) data which is to be written into the memory cell which is an operation target, in the second latch, responds to a program generating command of a write-in instruction, transfers the LSB data from the second latch to a first latch for copying, writes the LSB data into the memory cell, and then selects an adjacent word line which the LSB data is to be written in next in a column direction on an identical bit line, uses an erasing level to perform write-in which is weaker than the data write-in, and verifies soft programming of the amount of one page.

2. A non-volatile memory device, comprising:
a non-volatile memory cell array having a plurality of memory cells for storing multi-values by setting a plurality of different threshold voltages for each memory cell of the memory cell array; and
a control circuit, controlling a write-in operation to the memory cell array,
wherein when data is to be written into a memory cell, the control circuit selects an adjacent word line, uses an erasing level to perform write-in which is weaker than the data write-in, and verifies soft programming of the amount of one page, such that a narrow-banded erasing level distribution is realized in an adjacent memory cell, the data of one page being a set of bit data which is to be written into a plurality of memory cells on a word line during one write-in operation, and
the control circuit stores LSB (Least Significant Bit) data which is to be written into the memory cell which is an operation target, in the second latch, responds to a program generating command of a write-in instruction, selects an adjacent word line which the LSB data is to be written in next in a column direction on an identical bit line, uses an erasing level to perform write-in which is weaker than the data write-in, verifies soft programming of the amount of one page, and then transfers the LSB data from the second latch to a first latch for copying, and writes the LSB data into the memory cell.

3. A write-in method for a non-volatile semiconductor memory device, the non-volatile semiconductor memory device including a non-volatile memory cell array having a plurality of memory cells for storing multi-values by setting a plurality of different threshold voltages for each memory cell, and a control circuit for controlling a write-in operation to the memory cell array, the write-in method comprising:
when data is to be written into a memory cell and using the control circuit,
selecting an adjacent word line;
using an erasing level to perform write-in which is weaker than the data write-in; and
verifying soft programming of the amount of one page, such that a narrow-banded erasing level distribution is realized in an adjacent memory cell, the data of one page being a set of bit data which is to be written into a plurality of memory cells on a word line during one write-in operation,
wherein the control circuit stores LSB (Least Significant Bit) data which is to be written into the memory cell which is an operation target, in the second latch, responds to a program generating command of a write-in instruction, transfers the LSB data from the second latch to a first latch for copying, writes the LSB data into the memory cell, and then selects an adjacent word line which the LSB data is to be written in next in a column direction on an identical bit line, uses an erasing level to perform write-in which is weaker than the data write-in, and verifies soft programming of the amount of one page.

4. A write-in method for a non-volatile semiconductor memory device, the non-volatile semiconductor memory device including a non-volatile memory cell array having a plurality of memory cells for storing multi-values by setting a plurality of different threshold voltages for each memory cell, and a control circuit for controlling a write-in operation to the memory cell array, the write-in method comprising:
- when data is to be written into a memory cell and using the control circuit,
- selecting an adjacent word line;
- using an erasing level to perform write-in which is weaker than the data write-in; and
- verifying soft programming of the amount of one page, such that a narrow-banded erasing level distribution is realized in an adjacent memory cell, the data of one page being a set of bit data which is to be written into a plurality of memory cells on a word line during one write-in operation,
- wherein the control circuit stores LSB (Lease Significant Bit) data which is to be written into the memory cell which is an operation target, in the second latch, responds to a program generating command of a write-in instruction, selects an adjacent word line which the LSB data is to be written in next in a column direction on an identical bit line, uses an erasing level to perform write-in which is weaker than the data write-in, verifies soft programming of the amount of one page, and then transfers the LSB data from the second latch to a first latch for copying, and writes the LSB data into the memory cell.

5. A non-volatile memory device, comprising:
- a non-volatile memory cell array having a plurality of memory cells for storing multi-values by setting a plurality of different threshold voltages for each memory cell of the memory cell array; and
- a control circuit, controlling a write-in operation to the memory cell array,
- wherein when data is to be written into a memory cell, the control circuit selects an adjacent word line, uses an erasing level to perform write-in which is weaker than the data write-in, and verifies soft programming of the amount of one page such that a narrow-banded erasing level distribution is realized in an adjacent memory cell, the data of one page being a set of bit data which is to be written into a plurality of memory cells on a word line during one write-in operation, and
- the control circuit stores MSB (Most Significant Bit) data which is to be written into the memory cell which is an operation target, in the second latch, responds to a program generating command of a write-in instruction, transfers the MSB data from the second latch to a first latch for copying, writes the MSB data into the memory cell, and then selects an adjacent word line which the MSB data is to be written in next in a column direction on an identical bit line, uses an erasing level to perform write-in which is weaker than the data write-in, and verifies soft programming of the amount of one page.

6. A non-volatile memory device, comprising:
- a non-volatile memory cell array having a plurality of memory cells for storing multi-values by setting a plurality of different threshold voltages for each memory cell of the memory cell array; and
- a control circuit, controlling a write-in operation to the memory cell array,
- wherein when data is to be written into a memory cell, the control circuit selects an adjacent word line, uses an erasing level to perform write-in which is weaker than the data write-in, and verifies soft programming of the amount of one page such that a narrow-banded erasing level distribution is realized in an adjacent memory cell, the data of one page being a set of bit data which is to be written into a plurality of memory cells on a word line during one write-in operation, and
- the control circuit stores MSB (Most Significant Bit) data which is to be written into the memory cell which is an operation target, in the second latch, responds to a program generating command of a write-in instruction, selects an adjacent word line which the MSB data is to be written in next in a column direction on an identical bit line, uses an erasing level to perform write-in which is weaker than the data write-in, verifies soft programming of the amount of one page, and then, transfers the MSB data from the second latch to a first latch for copying, and writes the MSB data into the memory cell.

7. A write-in method for a non-volatile semiconductor memory device, the non-volatile semiconductor memory device including a non-volatile memory cell array having a plurality of memory cells for storing multi-values by setting a plurality of different threshold voltages for each memory cell of the memory cell array, and a control circuit for controlling a write-in operation to the memory cell array, the write-in method comprising:
- when data is to be written into a memory cell,
- selecting an adjacent word line;
- using an erasing level to perform write-in which is weaker than the data write-in; and
- verifying soft programming of the amount of one page such that a narrow-banded erasing level distribution is realized in an adjacent memory cell, the data of one page being a set of bit data which is to be written into a plurality of memory cells on a word line during one write-in operation,
- wherein the control circuit stores MSB (Most Significant Bit) data which is to be written into the memory cell which is an operation target, in the second latch, responds to a program generating command of a write-in instruction, transfers the MSB data from the second latch to a first latch for copying, writes the MSB data into the memory cell, and then selects an adjacent word line which the MSB data is to be written in next in a column direction on an identical bit line, uses an erasing level to perform write-in which is weaker than the data write-in, and verifies soft programming of the amount of one page.

8. A write-in method for a non-volatile semiconductor memory device, the non-volatile semiconductor memory device including a non-volatile memory cell array having a plurality of memory cells for storing multi-values by setting a plurality of different threshold voltages for each memory cell of the memory cell array, and a control circuit for controlling a write-in operation to the memory cell array, the write-in method comprising:
- when data is to be written into a memory cell and using the control circuit,
- selecting an adjacent word line;
- using an erasing level to perform write-in which is weaker than the data write-in; and
- verifying soft programming of the amount of one page such that a narrow-banded erasing level distribution is realized in an adjacent memory cell, the data of one page being a set of bit data which is to be written into a plurality of memory cells on a word line during one write-in operation,
- wherein the control circuit stores MSB (Most Significant Bit) data which is to be written into the memory cell which is an operation target, in the second latch, responds to a program generating command of a write-in instruction, selects an adjacent word line which the MSB data is to be written in next in a column direction on an identical bit line, uses an erasing level to perform write-in which is weaker than the data write-in, verifies soft programming of the amount of one page, and then, transfers the MSB data from the second latch to a first latch for copying, and writes the MSB data into the memory cell.

* * * * *

UNITED STATES PATENT AND TRADEMARK OFFICE
CERTIFICATE OF CORRECTION

| | | |
|---|---|---|
| PATENT NO. | : 8,738,836 B2 | Page 1 of 1 |
| APPLICATION NO. | : 12/808265 | |
| DATED | : May 27, 2014 | |
| INVENTOR(S) | : Yano | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 941 days.

Signed and Sealed this
Eleventh Day of August, 2015

Michelle K. Lee
*Director of the United States Patent and Trademark Office*